United States Patent [19]

Westervelt

[11] Patent Number: 4,819,842
[45] Date of Patent: Apr. 11, 1989

[54] RADIATION SUPPLY AND ADHESIVE DISPENSING SYSTEM

[75] Inventor: Richard A. Westervelt, Winsted, Conn.

[73] Assignee: Dymax Corporation, Torrington, Conn.

[21] Appl. No.: 92,566

[22] Filed: Sep. 3, 1987

[51] Int. Cl.$^4$ .............................................. B65D 83/14
[52] U.S. Cl. .................................. 222/642; 222/113; 222/179; 222/190; 222/394; 156/273.3; 156/275.7
[58] Field of Search ............... 222/639, 642, 179, 190, 222/325, 397, 399, 394, 113, 108; 250/229; 352/207; 156/273.3, 273.5, 275.5, 275.7; 118/641–643

[56] References Cited

U.S. PATENT DOCUMENTS

| 2,368,804 | 2/1945 | Chatelain | 352/207 X |
| 3,272,393 | 9/1966 | Roeser | 222/179 |
| 3,943,527 | 3/1976 | Hartmann | 222/108 X |
| 4,134,428 | 1/1979 | Björklund | 222/108 X |
| 4,231,494 | 11/1980 | Greenwood | 222/179 X |
| 4,380,308 | 4/1983 | Greenwood | 222/148 |
| 4,424,089 | 1/1984 | Sullivan | 156/273.5 X |
| 4,515,295 | 5/1985 | Dougherty | 222/113 |
| 4,588,468 | 5/1986 | McGinty et al. | 156/273.3 X |

OTHER PUBLICATIONS

Application Bulletin entitled "Advanced Assembly Technology through Adhesives", by American Chemical & Engineering Co., Inc. (2 pages).

Primary Examiner—Joseph J. Rolla
Assistant Examiner—Nils E. Pedersen
Attorney, Agent, or Firm—Ira S. Dorman

[57] ABSTRACT

A system for dispensing a radiation-curable adhesive substance employs a shutter for controlling the period of irradiation. A hand-held assembly, remote from the control unit of the system, permits convenient placement and curing of the adhesive deposit utilizing, respectively, a syringe for the containment of the substance and a light guide for transmitting the actinic radiation to the work site.

17 Claims, 4 Drawing Sheets

RADIATION SUPPLY AND ADHESIVE DISPENSING SYSTEM

BACKGROUND OF THE INVENTION

There are numerous industrial applications in which small, predetermined amounts of adhesive substances must be carefully deposited and then quickly cured. They include, for example, the wiring and assembly of printed circuit boards, attachment of surface-mounted devices, temporary securement of components prior to soldering, etc. In many instances, the use of acrylic adhesives containing a photoinitiator, to cause curing to be initiated by actinic radiation (most commonly ultraviolet light), will produce optimal results with maximum economy, speed and facility of manufacture; such adhesives are commercially available from Dymax Corporation of Torrington, Conn.

It has been proposed to provide a system for wire tacking, and the like, in which a hand-held manifold incorporates both a syringe for dispensing an adhesive substance and also the means for irradiating the site, e.g., by way of a so-called "light guide" device. Such a system would of course include a control unit remote from the hand-held assembly, for effecting the discharge of the adhesive and also for generating the activating radiation.

To achieve the best results with photoinitiated adhesives, it will usually be important that the period of irradiation be closely controlled. Furthermore, for self-evident reasons the adhesive substance must not be exposed to the radiation at the time it is being dispensed, and the dispenser itself must be maintained as free as possible from extraneous adhesive. Turning the radiation source on and off to achieve intermittent emission is often impractical because of the warm-up and cool-down times that are necessary with typical UV lamps to achieve uniform operation and reignition; moreover, it will also be disadvantageous from the standpoint of longevity, since the life of a UV lamp or similar radiation source may be significantly depleted by on-off cycling.

Accordingly, it is broad object of the present invention to provide a novel system for dispensing a radiation-curable liquid (normally, an adhesive) substance, and a novel control unit for use therein, by which the substance may be dispensed and irradiated using the same, hand-held assembly, and by which the periods of liquid dispensation and irradiation may be controlled without subjecting the radiation source device to on-off cycling.

More specific objects of the invention are to provide such a system and control unit wherein both the means for effecting liquid discharge and also the radiation source are contained in a common housing, utilizing the same power supply and a common manual actuating switch, and to provide a remote, hand-held dispenser assembly which is convenient and facile to use.

Additional objects of the invention are to provide such a system and unit having the foregoing features and advantages, which may be used to efficiently and neatly achieve bonding of electrical components and other parts, and which minimize difficulties such as might result from fouling of the dispensing device.

SUMMARY OF THE INVENTION

It has now been found that certain of the foregoing and related objects of the invention are attained by the provision of a system which includes a control unit having electrically powered radiation source means therein and an opening therefrom in effective registry with the source means, and electrically operated shutter means comprising a shutter member that is adapted and selectively operable to block the passage of radiation from the source means through the opening. The control unit also has selectively-operable electrical air valve means, for either preventing or permitting the passage of a supply of pressurized air; a first variable timer operatively connected to the valve means for controlling the period during which the passage of air is permitted; a second variable timer operatively connected to the shutter means for controlling the period during which such passage of radiation is permitted; electrical power supply means operatively connected to the radiation source means, to the shutter means and to the valve means for energization thereof; and means for connecting a source of pressurized air to the air valve. The system additionally includes manually operable switch means, and the power supply means, the switch means and the timers thereof are cooperatively designed and interconnected for the selective, mutually exclusive connection of the power supply means to either the shutter means or the valve means, through the associated timers. A hand-held dispenser is provided which has a body with means providing a chamber for the containment of a liquid (normally an adhesive substance and for dispensing the substance therefrom at a certain point, and with means for mounting one end portion of a light guide member with its point of radiation emission disposed proximate the point of dispensing of liquid from the chamber. One end of a conduit is in pneumatic communication with the chamber of the dispenser, and a first end portion of a flexible light guide member is mounted, in the manner described, by the mounting means of the dispenser. The control unit has means for connecting the other end of the conduit with the air valve means, in pneumatic communication, and it has means for connecting the opposite end portion of the light guide member adjacent the opening of the unit and in registry with the radiation source means. By operation of the switch means to connect the power supply to the valve means the system will dispense substance at a location remote from the control unit, during an initial period of time controlled by the first timer; it will also permit the passage of radiation to the same vicinity to effect curing of the liquid substance, for a subsequent period of time controlled by the second timer, by operation of the switch means to connect the power supply to the shutter means.

In the preferred embodiments, the chamber-providing means will comprise a syringe having a barrel with a hollow needle at one end, and the pneumatic conduit provided will communicate with the other end of the barrel. The dispenser body may, in such a case, have a pair of side-by-side passages extending through it, one of the passages being adapted to seat the syringe barrel and the other being adapted to receive the light guide member. The needle of the syringe and the first end portion of the light guide member will extend in one direction, outwardly of the passages, and the other end of the barrel and the opposite end portion of the light guide member will extend outwardly of the passages in the opposite direction; the dispenser body will have means for securing the light guide member and the syringe therein.

The shutter member employed will advantageously comprise a part having a screen portion, and it will be mounted within the unit for movement between a first position, in which the screen portion is disposed in the path of radiation through the opening, to block its passage, and a position displaced from the path. Usually, the shutter means will include an electrically operated solenoid, to which the shutter member part is operatively connected for such movement.

The system will most desirably employ a control unit which additionally includes at least one vacuum-creating device. The device will preferably take the form of a pneumatic-effect transducer, in which case the unit will have means for receiving an external supply of pressurized air, connected to the air valve means and to the transducer for supplying air under pressure to both; the transducer may be connected to apply a constant vacuum force through the air valve. In addition, the control unit will desirably include means for selectively bypassing either or both of the timers, to thereby permit the periods of air flow and radiation passage to be controlled directly by operation of the switch means. The latter will generally be remote from the unit, and will preferably take the form of a foot-operated double-pole, double-throw switch.

Other objects are attained by the provision of a control unit for use in a system of the kind described. In its broad embodiment, the unit will comprise a housing having an opening, radiation source means in the housing in effective registry with the opening, and shutter means including a shutter member selectively operable to block the passage of radiation from the source means through the opening. The unit will also include valve means that is selectively operable to either prevent or permit the passage of air supplied to it, and coupling means for operatively connecting radiation-transmitting means and pneumatically operated liquid substance-dispensing means to the housing opening and the valve means, respectively, and for connecting the valve means to a pressurized air supply. In further embodiments, the control unit will include the components and features hereinbefore described with reference to the system in which it is used.

DETAILED DESCRIPTION OF THE ILLUSTRATED EMBODIMENT

Figure 1:
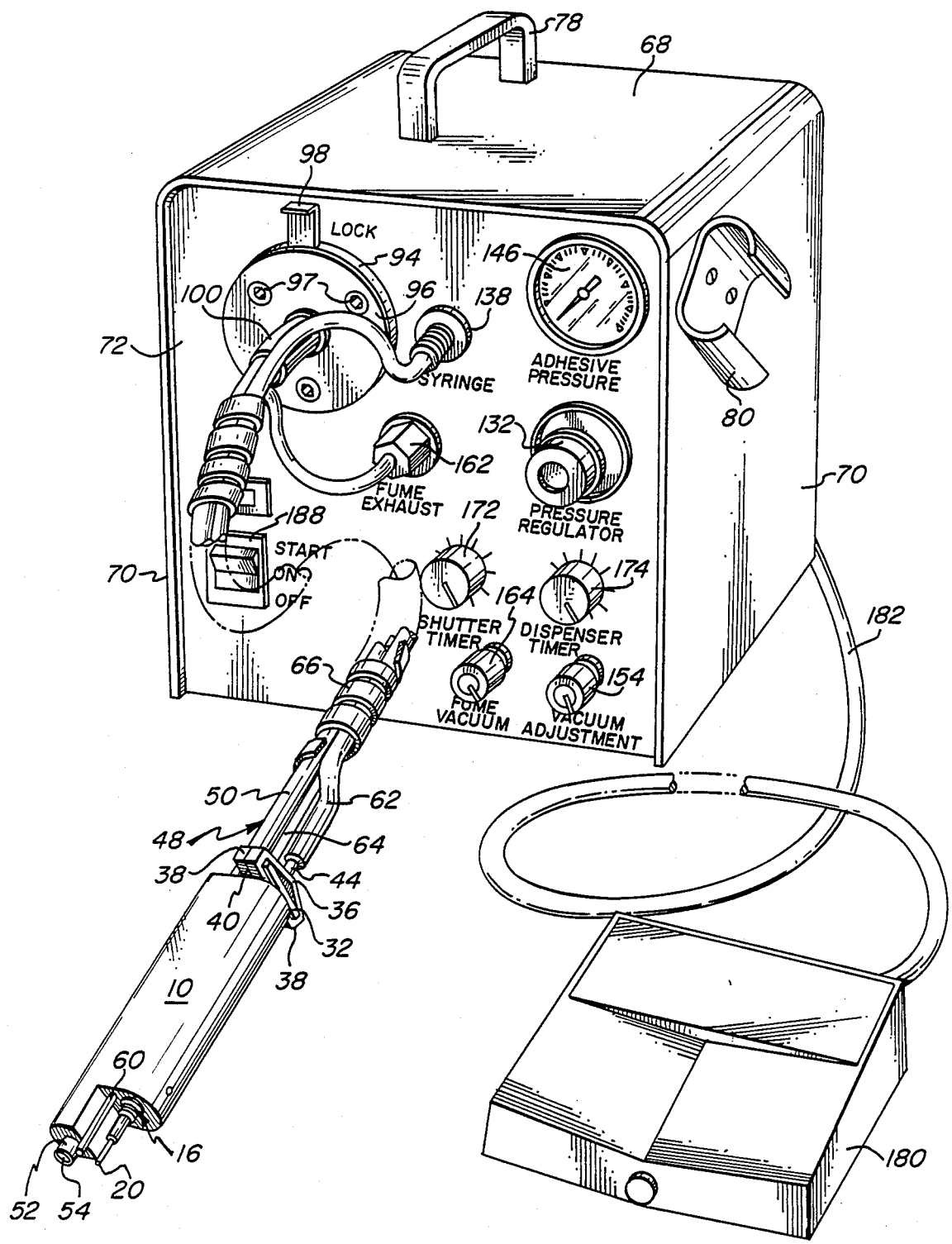
FIG. 1 is a perspective view of a system embodying the present invention.
Figure 2:
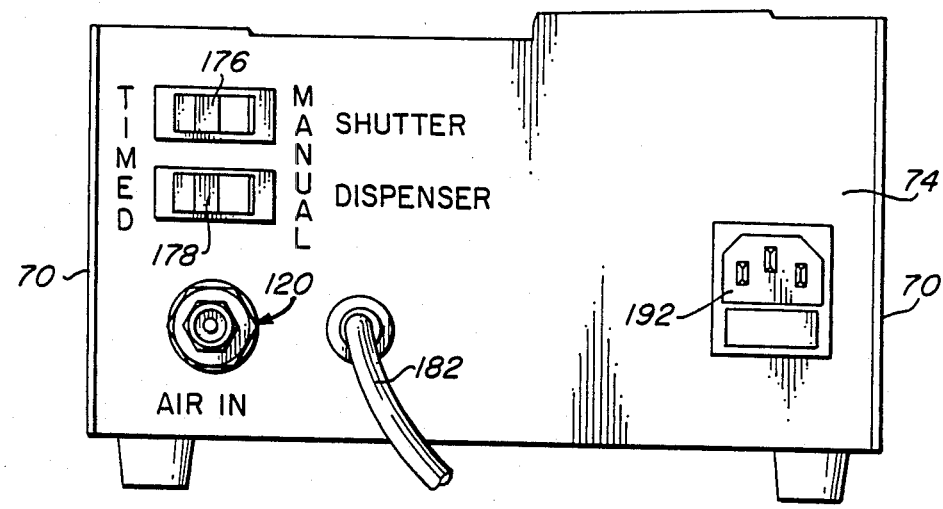
FIG. 2 is a fragmentary rear elevational view of the control unit utilized in the system of FIG. 1.
Figure 3:
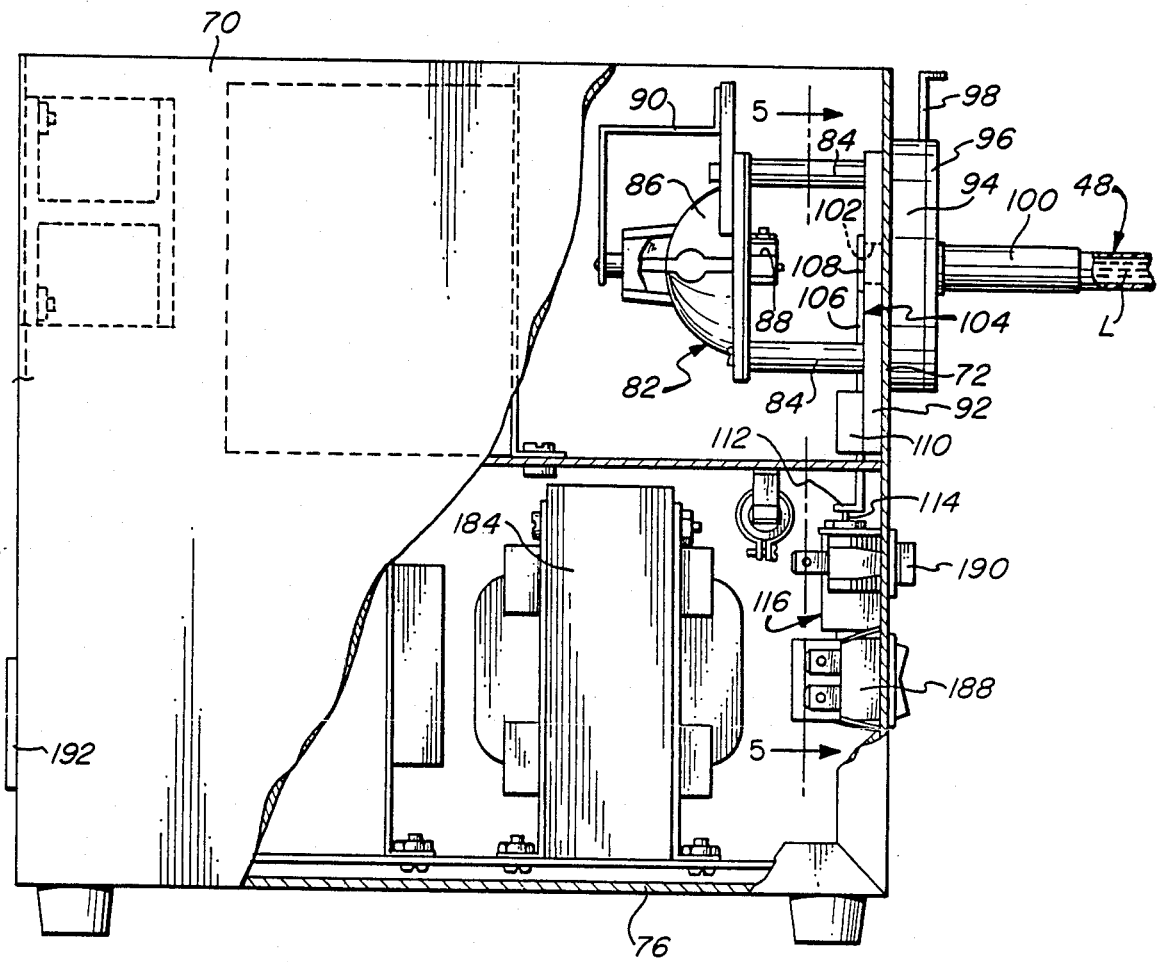
FIG. 3 is a side elevational view of the control unit, taken from the left side as shown in FIG. 1 and drawn to an enlarged scale, with a portion of the housing sidewall broken away to show internal features.
Figure 6:
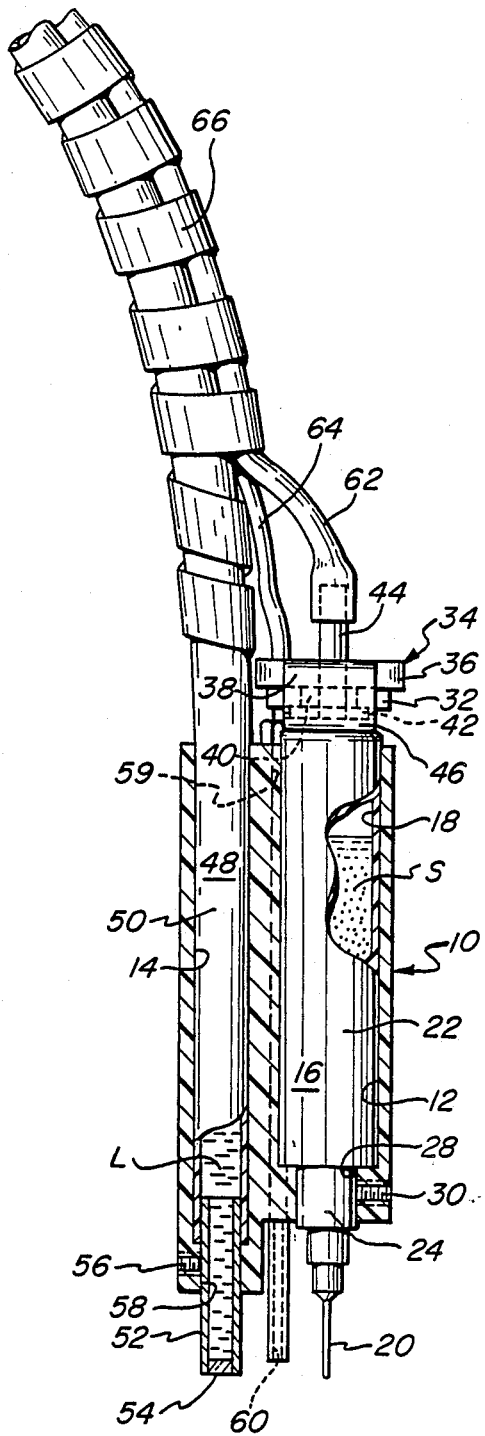
FIG. 6 is a elevational view of the hand-held dispenser assembly for the system, drawn to a scale enlarged from that of FIG. 1 and with portions in section to show internal structure.

Turning now in detail to the appended drawings, FIG. 1 illustrates the system of the invention, which consists of a hand-held dispenser assembly, a control unit, and a foot-operated switch. Considering the dispenser assembly initially, and as best seen in FIG. 6, it consists of an elongated body, generally designated by the numeral 10, having a first, generally cylindrical passageway 12 of relatively large cross section extending from one end and along one side, and a second cylindrical passageway 14 of smaller diameter extending parallel to the first and along the opposite side of the body. The passageway 12 seats an industrial syringe, generally designated by the numeral 16, which defines an internal cavity 18 within which is contained the liquid adhesive substance "S" to be dispensed. A hollow, blunt-tipped needle 20 is connected to one end of the tubular barrel 22 of the syringe 16 through a reduced diameter cylindrical neck portion 24, and adjacent sections of further reduced diameters. The neck portion 24 is inserted through the circular opening 28 at the outer end of the passageway 12 and is secured therein by the set screw 30, which is engaged within a radially extending aperture, to affix the syringe 16 with the needle 20 protruding from the body 10.

A T-shaped head portion 32 of the syringe 16 protrudes from the opposite end of the passageway 12 and mounts an adapter, generally designated by the numeral 34. The adapter consists of a crosspiece 36, from the opposite ends of which depend flanges 38 having inwardly directed lip elements 40 thereon. An annular hub portion, having a circumferential flange element 42, at its outer end, projects from the underside of the crosspiece 36, and a tubular nipple portion 41 extends oppositely therefrom in coaxial relationship to the hub portion. As will be appreciated, the adapter 34 is affixed on the head portion 32 of the syringe by aligning the parts and twisting the adapter thereupon with a quarter-turn action; this will dispose the hub portion directly over the mouth of the internal chamber 18 of the syringe barrel 22 for pneumatic communication therewith (through the nipple portion 44), an air-tight seal being created by interpositioning of the annular gasket 46 therebetween.

A flexible light guide, generally designated by the numeral 48, is engaged within the smaller passageway 14 of the body 10. It consists of a flexible plastic tube 50 (which may have a surrounding metal sheath thereon), with ferrules 52, 100 on its opposite ends; ferrule 52 is closed by a quartz lens 54, and is secured within the reduced diameter opening 58 of the passageway 14 by a radially extending set screw 56. The light guide is filled with a radiation-transmitting liquid "L"; such devices well known in the art and are commercially available, and it will be appreciated that a fiber-optics form of light guide could be substituted if so desired.

A third longitudinal passageway 59 extends through the body 10 along an axis parallel to those of the passageways 12, 14, and serves to receive a small diameter pipe 60. Flexible hoses 62 and 64 are attached, respectively, to the nipple portion 44 on the syringe adapter 34 and to the inner end of the pipe 60, and they are held in close association with the tube 50 of the light guide 48 by a spiral plastic wrap or harness 66.

The housing of the control unit consists of mated U-shaped sheet-metal pieces, one providing a top wall portion 68 and sidewall portions 70, the other providing front and back panels 72, 74 respectively, and a floor panel 76; the housing also incorporates suitable internal partitions and supporting structure (unnumbered). A handle 78 is attached to the top wall portion 68, and a bracket 80 is secured to one of the sidewalls 70 and is configured to hold the body 10 of the hand-held dispenser assembly.

A subsystem for producing actinic radiation, generally designated by the numeral 82, includes a reflector/lamp assembly 86, 88, supported by four posts 84 upon a mounting plate 92, and suitable electrical connections, such as the negative electrode 90; usually, an ultraviolet lamp will be employed. The mounting plate 92 is disposed against the inside surface of the front panel 72, and a bezel mount center piece 94 and front piece 96 are affixed by screws 97 thereto on the outside of the panel 72, and support a locking slide 98. The slide 98 cooperates with the ferrule 100 on the end of the light guide 48 to secure it within the bezel mount, in registry with the aligned apertures 102 through the front panel 72 and the mounting plate 92.

Figure 5:
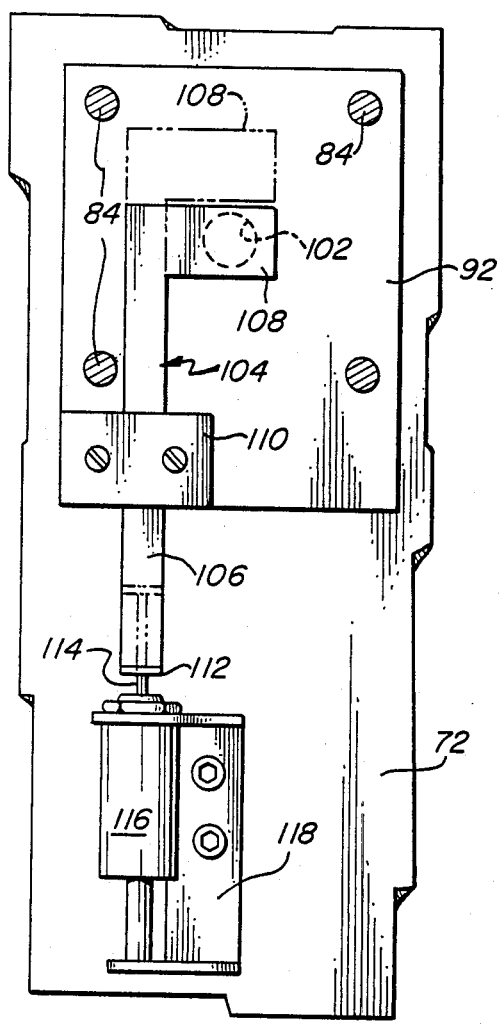
FIG. 5 is a fragmentary view, taken from the inside of the housing and showing the shutter mechanism utilized in the unit.

As best seen in FIG. 5, the mounting plate 92 supports a shutter piece, generally designated by the numeral 104, which consists of an elongated shank portion 106 and a rectangular screen portion 108 extending laterally from one end thereof. A hold-down bar 110 is affixed to the plate 92 in overlying relationship to the shank portion 106 of the shutter piece 104, and the underside of the bar 110 is notched to permit movement of the shutter piece. An upturned flange element 112 is provided at the inner end of the shank portion 106, and serves to engage the shaft 114 of the armature of a solenoid, generally designated by the numeral 116, which is supported by a mounting bracket 118 attached to the front panel 72 of the housing.

As will be appreciated, actuation of the solenoid 116 will cause the shutter 104 to shift from the full line position to the phantom line position depicted in FIG. 5. This will displace the screen portion 108 from alignment over the apertures 102, unblocking them and thereby permitting the passage of radiation from the source 88 thereof into and through the liquid core "L" of the light guide 48, ultimately to be emitted through the lens 54. Normally, the mechanism will block the transmission of radiation from the unit, thus permitting the source 88 to be left on and thereby facilitating use and maximizing bulb life.

The shutter piece may of course take many different forms. For example, rather than having an offset part (such as portion 108), it may consist simply of a flat, straight bar that is shiftable to align an aperture provided therethrough with those of the panel 72 and the plate 92, to permit radiation to pass. Indeed, because of its symmetry such an alternative form of shutter piece will be preferred in many instances.

Figure 4:
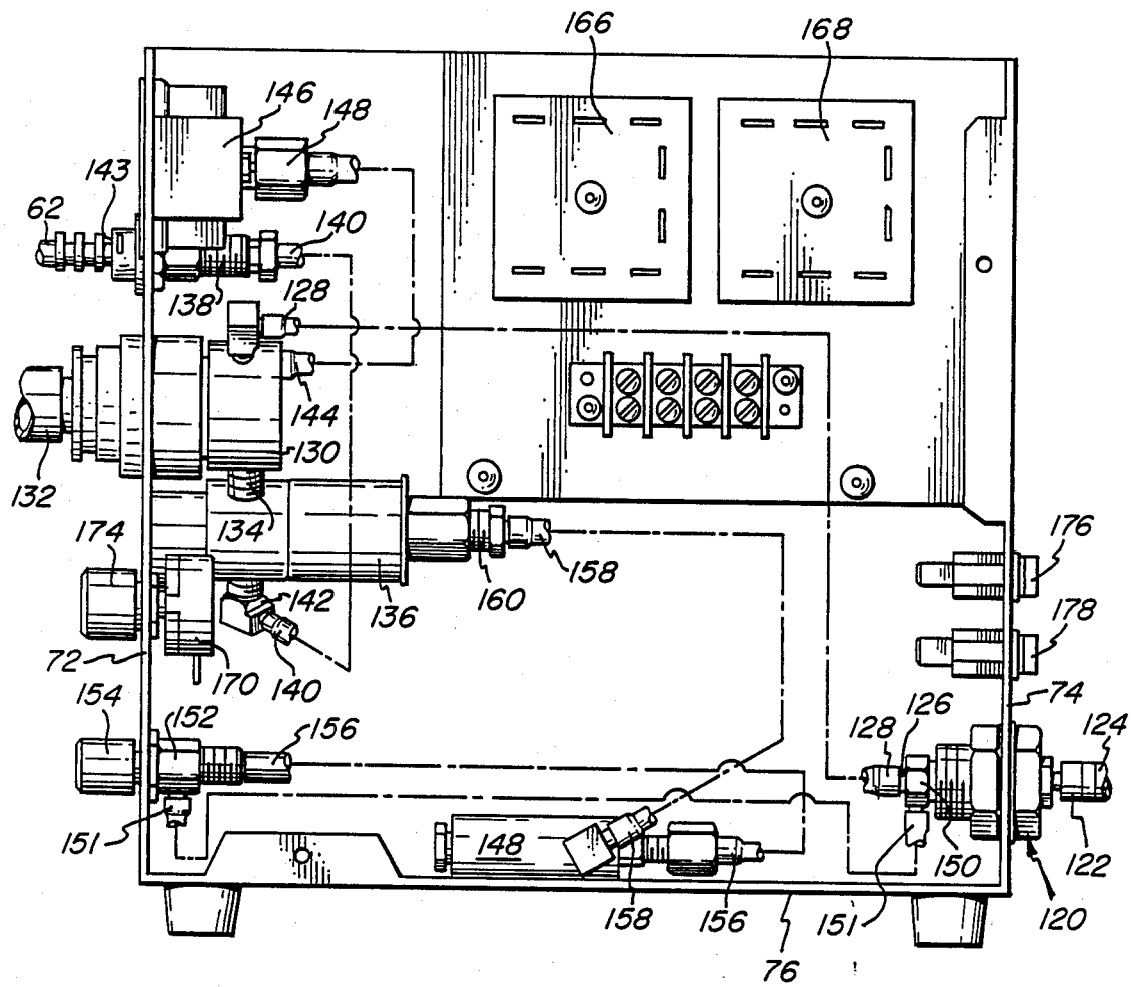
FIG. 4 is a view similar to FIG. 3, taken from the opposite side of the unit.

With particular reference now to FIG. 4, it is seen that the rear panel 74 of the housing mounts an air conduit coupling fixture, generally designated by the numeral 120, which engages the coupling piece 122 on the end of an air supply line 124 (leading from a pressurized air source, not shown). A nipple 126 of the fixture 120, disposed within the housing, is inserted into one end of an air tube 128, and the opposite end is connected to a pressure regulator 130, the control knob 132 for which is disposed on the outside of the front panel 72. The pressure regulator 130 is in air flow communication with a solenoid valve 136, through a short threaded nipple 134, and is in operative connection with a syringe coupling fixture 138 through the tube 140, which extends thereto from the elbow fitting 142 on the valve. The syringe hose 62 is connected into the pneumatic system thus described by attachment to a nipple 143 of the coupling fixture 138, presented on the outside of the front panel 72. A second tube 144 leads from the pressure regulator 130 to the pressure gauge 146, the dial of which is exposed on the panel 72.

A venturi-effect vacuum transducer, generally designated by the numeral 148, is contained within the housing and is mounted upon the floor panel 76. The air inlet coupling fixture 120 has a tap connector at 150, and a line 151 runs from it to a vacuum adjustment needle valve 152, the control knob 154 for which is disposed on the front panel 72. Another line 156 connects the needle valve 152 to the inlet side of the transducer 148, and the outlet side is attached to the coupling 160 of the solenoid valve 138 by tube 158. Air flowing through the tubes 151 and 156 will create a slight negative pressure in the line 158, the magnitude of which will depend upon the adjustment of the needle valve 152, which will be drawn constantly through the valve 136 and impressed upon the syringe cavity 18, through the hose 62.

As will be self-evident, the solenoid valve 136 may be positioned so as to permit the passage of air from the inlet line 124, at a pressure controlled by the regulator 130, to pressurize the chamber 18 of the syringe 16 and thereby force the adhesive substance "S" through the needle 20. The vacuum force drawn will be of sufficiently low value to be overcome by the positive air pressure effect; when the valve 136 is closed to positive air flow, however, the negative pressure will be effective to induce suck-back of the substance "S", thereby minimizing dripping or other spurious discharge and maintaining the needle 20 substantially free from extraneous adhesive, as would otherwise readily cure and tend to produce blockage of the discharge orifice.

A second vacuum transducer (not shown) is contained within the housing, and is operatively connected (by means similar to that described with respect to transducer 148, and also not shown) into the pneumatic system. An associated coupling fixture 162 is mounted on the front panel 72, and receives the end of the hose 62 attached to the pipe 60. A needle valve, not illustrated but having an adjustment knob 164 exposed on the front panel 72, is connected into the system to control the vacuum force that is created and is impressed upon the line 64. This subsystem serves to evacuate the working zone, as is desirable in those instances in which the adhesive substance employed has a tendency for off-gasing during curing.

Two electronic timers, 166 and 168, are provided within the housing and are connected to the shutter mechanism solenoid 116 and the pneumatic system solenoid valve 136, respectively. A potentiometer 170 is connected to each timer 166, 168; only one of them is visible in FIG. 4, but the control knobs 172, 174 for both the shutter and dispenser potentiometers, respectively, are visible in FIG. 1 on the front of the panel 72. The circuits for the shutter and pneumatic valve systems also include rocker switches 176, 178, respectively, to permit selection between timed and manual operation.

A foot-operated double-pole, double-throw switch 180 is connected into the system circuitry by an electrical cable 182. The power supply unit, including transformer 184, may be connected to a voltage source through the electrical plug receptacle 192, which contains the line fuse present on the rear panel 74, and an illuminated, two-position power switch 188 is installed on the front panel 72.

It is believed that operation of the system will be evident from the foregoing description. When it is desired to bond a component, or to produce an adhesive deposit for any other purpose, the rocker pedal of the foot switch 180 is pressed in the proper direction (i.e., to either the left or the right). Doing so will open the solenoid valve 136, thus permitting the flow of air from the pressure regulator 130 and creating a positive pressure (of a magnitude controlled by the regulator 130) in the head space above the adhesive substance "S" in the syringe 16. This will of course cause the substance to be forced through the needle 20 onto the workpiece, in an amount controlled by the settings of both the pressure regulator and also the dispenser timer 168. It will be appreciated that the electronics of the control unit are such that the time period selected will be maintained until changed, so that the same quantity of adhesive will be discharged each time the foot switch 180 is actuated to open the value 136.

Depressing the opposite side of the foot switch will activate the solenoid 116 of the shutter mechanism, so as to displace the screen portion 108 from the apertures 102 and thereby permit the radiation from the source 88 to impinge upon the adhesive deposit, transmitted thereto through the light guide 48. The time of irradiation will depend upon the setting of the shutter timer 116 and, here again, the period will remain the same so as to permit precise control of the radiation dosage on a repetitive basis.

It will be understood that the UV lamp or other radiation source will desirably be left on for extended periods of time (e.g., throughout an entire work shift), with the shutter mechanism serving to avoid the need for on-off cycling. At the commencement of operation, the switch 188 will be pushed to the "start" position, permitting a high voltage surge to produce ignition, as is necessary when the radiation source is a UV light. Upon release, the switch will move to the "on" position, thus permitting the lamp to continue to burn until it is turned off. This arrangement for ignition of the lamp is of course a function of the power supply, which may be such as to make different "start" and "on" positions unnecessary.

As noted, the switches 176, 178 on the rear of the unit may be used to condition the system for manual, rather than timed, operation. Depressing the pedal of the foot switch 180 in the manual mode will either cause the air valve to open or the shutter to be displaced, depending of course upon the direction in which it is pushed; shifting of the switch pedal will terminate whichever effect has been initiated, so that periods of dispensation of adhesive and of irradiation occur only on a mutually exclusive basis.

Additions and modifications can of course be made to the system illustrated, within the concept of the instant invention, as will be apparent to those skilled in the art. For example, the control unit will normally include a fan or blower to avoid overheating, to maintain a constant temperature (and hence minimize output variation) once equilibrium is attained, and to promote cooling of the radiation source to facilitate restarting after it is turned off. Although the electrical and pneumatic subsystems described are presently regarded to represent the best mode for carrying out the invention, alternatives are of course within its scope and will be evident to those skilled in the art, as will the details of the circuitry and valving employed in the illustrated embodiment.

Thus, it can be seen that the present invention provides a novel system for dispensing a radiation-curable liquid substance normally an adhesive, and a novel control unit for use therein. The substance may be dispensed and irradiated, to initiate curing, from the same hand-held assembly, and the time of irradiation can be controlled without requiring on-off cycling of the source. In addition, both the means for effecting substance discharge and also the radiation source are contained in a common housing; they utilize the same power supply and are actuated by a common manual switch, and the system includes a remote, hand-held dispenser assembly which is convenient and comfortable to use. Highly effective and efficient bonding of electrical components and other parts is achieved with the system and control unit of the invention; operation is neat and convenient, and difficulties of the kind that would result from fouling of the dispensing device are minimized.

Having thus described in invention, what is claimed is:

1. A system for dispensing a radiation-curable liquid substance comprising, in combination:
  (a) a control unit having electrically powered radiation source means therein and an opening therefrom in effective registry with said source means; electrically operated shutter means including a shutter member adapted to block the passage of radiation from said source means through said opening, said shutter means being selectively operable to cause said shutter member to either prevent or permit such passage of radiation; electrically-operated air valve means selectively operable to either prevent or permit the passage of pressurized air supplied thereto; a first variable timer operatively connected to said valve means for controlling the period during which such passage of air is permitted; a second variable timer operatively connected to said shutter means for controlling the period during which such passage of radiation is permitted; electrical power supply means operatively connected to said radiation source means, shutter means and valve means for energization thereof; and means for connecting a source of pressurized air to said air valve;
  (b) manually operable switch means, said power supply means, said switch means and said timers being cooperatively designed and interconnected for the selective, mutually exclusive connection of said power supply means to either said shutter means or said valve means through the associated one of said timers;
  (c) a hand-held dispenser comprising a body with means providing a chamber for the containment of liquid substance and for dispensing the substance therefrom at a certain point, and with means for mounting one end portion of a light guide member with a point of emission of radiation therefrom disposed proximate said point of dispensing of substance from said chamber;
  (d) a conduit having two opposite ends, one of said ends of said conduit being in pneumatic communication with said chamber of said dispenser; and
  (e) a flexible light guide member having two opposite ends, a at first end portion at one of said guide member ends being so mounted by said mounting means of said dispenser; said control unit additionally having means for connecting the other end of said conduit in pneumatic communication with said air valve means, and having means for connecting the opposite end portion of said light guide member adjacent said opening of said unit with the end of said guide member thereat in registry with said radiation source means, whereby said system can be used to dispense liquid substance at a location remote from said control unit during an initial period of time, controlled by said first timer, by operation of said switch means to connect said power supply means to said valve means, and to effect the passage of radiation to said location for a second period of time following said initial period, controlled by said second timer, by operation of said switch means to connect said power supply means to said shutter means, to effect curing of the substance.

2. The system of claim 1 wherein said chamber-providing means comprises a syringe having a hollow barrel with a hollow needle at one end, said conduit communicating with the other end of said barrel and said dispenser being adapted to discharge the liquid substance.

3. The system of claim 2 wherein said dispenser body has a pair of side-by-side passages extending through it, one of said passages being adapted to seat said syringe barrel therein and the other of said passages being adapted to receive said light guide member therethrough, said needle and said first end portion of said light guide member extending in one direction outwardly of said passages, and said other end of said barrel and said opposite end portion of said light guide member extending outwardly of said passages in the opposite direction, said dispenser body having means for securing said light guide member and said syringe therein.

4. The system of claim 1 wherein said shutter member comprises a part having a screen portion and is mounted within said unit for movement between a first position, in which said screen portion is disposed in the path of radiation through said opening to block the passage thereof, and a position displaced therefrom, and wherein said shutter means includes a solenoid to which said shutter member part is operatively connected for movement between said positions thereof.

5. The system of claim 1 wherein said unit additionally includes at least one vacuum-creating device.

6. The system of claim 5 wherein said vacuum-creating device is a pneumatic-effect transducer, and wherein said control unit has means for receiving a supply of pressurized air from an external source, said air supply-receiving means being connected to said air valve means and to said transducer for supplying air under pressure to both.

7. The system of claim 6 said transducer is connected to said air valve means for establishing a vacuum thereat.

8. The system of claim 1 wherein said control unit additionally includes means for selectively bypassing either or both of said timers to thereby permit said periods of air flow and radiation passage to be controlled directly by operation of said switch means.

9. The system of claim 1 wherein said switch means is remote from said unit.

10. The system of claim 9 wherein said switch means comprises a double-pole, double-throw foot-operated switch.

11. A control unit for use in a system for dispensing a radiation-curable liquid substance, comprising:
(a) a housing having an opening therefrom;
(b) radiation source means in said housing in effective registry with said opening;

(c) shutter means including a shutter means adapted and disposed for blocking the passage of radiation from said source means through said opening, said shutter means being selectively operable to cause said shutter member to either prevent or permit such passage of radiation;
(d) air valve means selectively operable to either prevent or permit the passage of air supplied thereto;
(e) coupling means for operatively connected radiation-transmitting means and pneumatically operated substance-dispensing means to said housing opening and said valve means, respectively, and for connecting said valve means to a pressurized air supply, whereby said unit can be used to control both the dispensation and also the irradiation of liquid substance at a location remote therefrom;
(f) a first variable timer operatively connected to said valve means for controlling the period during which such passage of air is permitted; and
(g) a second variable timer operatively connected to said shutter means for controlling the period during which such passage of radiation is permitted, whereby said unit can be used to dispense substance during an initial period of time, controlled by said first time, and to effect the passage of radiation for a second period of time following said initial period, controlled by said second timer.

12. The unit of claim 11 additionally including power supply means operatively connected to said radiation source means, shutter means and valve means for energization of each, and manually operable switch means, said power supply means, said switch means and said timers being cooperatively designed and interconnected for the selective, mutually exclusive connection of said power supply means to either said shutter means or said valve means through the associated one of said timers.

13. The unit of claim 11 wherein said shutter member comprises a part having a screen portion and is mounted within said unit for movement between a first position, in which said screen portion is disposed in the path of radiation through said opening to block the passage thereof, and a position displaced therefrom, and wherein said shutter means includes a solenoid to which said shutter member part is operatively connected for movement between said positions thereof.

14. The unit of claim 11 additionally including a pneumatic-effect vacuum transducer, said coupling means also operatively connecting said transducer to the air supply for operation thereof.

15. The unit of claim 12 additionally including means for selectively bypassing either or both of said timers to thereby permit the periods of air flow and radiation passage to be controlled directly by operation of said switch means.

16. A system for dispensing a radiation-curable liquid substance comprising, in combination:
(a) a control unit having radiation source means therein and an opening therefrom in effective registry with said source means; shutter means including a shutter member adapted to block the passage of radiation from said source means through said opening, said shutter means being selectively operable to cause said shutter member to either prevent or permit such passage of radiation; air valve means selectively operable to either prevent or permit the passage of pressurized air supplied thereto; and means for connecting a source of pressurized air to said air valve means;

(b) manual switch means remote from said control unit for the selective, mutually exclusive operation of either said shutter means or said valve means;

(c) a hand-held dispenser comprising a body with means providing a chamber for the containment of liquid substance and for dispensing the substance therefrom at a certain point, and with means for mounting one end portion of a light guide member with a point of emission of radiation therefrom disposed proximate said point of dispensing of substance from said chamber;

(d) a conduit having two opposite ends, one of said ends of said conduit being in pneumatic communication with said chamber of said dispenser; and (e) a flexible light guide member having two opposite ends, a first end portion at one of said guide member ends being so mounted by said mounting means of said dispenser; said control unit additionally having means for connecting the other end of said conduit in pneumatic communication with said air valve means, and having means for connecting the opposite end portion of said light guide member adjacent said opening of said unit with the end of said guide member thereat in registry with said radiation source means whereby, by operation of said switch means, said system can be used to dispense liquid substance at a location remote from said control unit during an initial period of time, and to effect the passage of radiation to said location for a second period of time following said initial period, to effect curing of the liquid substance.

17. The system of claim 16 wherein said control unit additionally includes vacuum means for creating a vacuum, and wherein said system additionally includes a second conduit, with two opposite ends, one of said opposite ends being in gas flow communication with said vacuum means, and the other of said ends of said second conduit being disposed proximate said points of emission and dispensing, said dispenser having means supporting said second conduit with said other end thereof so disposed.

* * * * *

UNITED STATES PATENT AND TRADEMARK OFFICE
CERTIFICATE OF CORRECTION

PATENT NO. : 4,819,842

DATED : April 11, 1989

INVENTOR(S) : Richard A. Westervelt

It is certified that error appears in the above-identified patent and that said Letters Patent is hereby corrected as shown below:

Claim 11, column 10, line 1, change "means" (second occurrence) to --member--; same claim, line 10, change "connected" to --connecting--; same claim, line 26, change "time" to --timer--.

Claim 15, column 10, line 52, change "12" to --11--

Claim 16, column 12, line 10, delete "liquid"

Signed and Sealed this

Twenty-sixth Day of September, 1989

Attest:

DONALD J. QUIGG

Attesting Officer

Commissioner of Patents and Trademarks